United States Patent [19]

Furnival

[11] 3,832,606

[45] Aug. 27, 1974

[54] SEMICONDUCTOR DIODE PACKAGE WITH PROTECTION FUSE

[75] Inventor: Thomas J. Furnival, Kokomo, Ind.

[73] Assignee: General Motors Corporation, Detroit, Mich.

[22] Filed: Feb. 15, 1973

[21] Appl. No.: 332,630

[52] U.S. Cl. ...... 317/234 R, 317/234 A, 317/234 G, 317/234 H, 317/33, 317/40 A, 320/17

[51] Int. Cl. ............................ H01l 3/00, H01l 5/00

[58] Field of Search .............. 317/234, 1, 4, 4.1, 33, 317/48 A; 320/17

[56] References Cited

UNITED STATES PATENTS

| | | | |
|---|---|---|---|
| 2,979,644 | 4/1961 | Salzer | 317/234 |
| 3,213,345 | 10/1965 | Loftus | 320/17 |
| 3,575,645 | 4/1971 | Doversberger | 317/234 |
| 3,601,667 | 8/1971 | Desmond | 317/234 |
| 3,693,048 | 9/1972 | Furnival et al. | 31/234 |

*Primary Examiner*—Andrew J. James
*Attorney, Agent, or Firm*—Robert J. Wallace

[57] ABSTRACT

A circuit element for suppressing electrical transients. The circuit element includes a semiconductor diode and a distinctive fusible device encapsulated within a single housing. The fusible device is a metallic fuse element which is surrounded by an insulating jacket of polyimide plastic. The semiconductor diode is supported on a thermal expansion compensating element which in turn is mounted in a recess of a thin walled metallic housing member. A similar metallic member serves as a cover for the housing. The fusible device connects the diode with an insulatingly mounted electrically conductive lead that extends through the coer.

2 Claims, 2 Drawing Figures

SEMICONDUCTOR DIODE PACKAGE WITH PROTECTION FUSE

BACKGROUND OF THE INVENTION

This invention relates to a circuit element for suppressing electrical transients. More particularly, it relates to a distinctive fusible device in series with a semiconductor diode, both of which are encapsulated within a single housing.

It is well known that a particular element of an electrical circuit can be subjected to undesirable current or voltage transients. To protect this element, it has been general practice to place a transient suppressing package in parallel with the element to provide a current path through which the transients may pass without damage to the element being protected. For example, a Zener diode can be connected in parallel with a load to maintain a constant voltage across the load at a predetermined level. Should the load be subjected to a voltage of a higher level, the current through the Zener diode increases to maintain the voltage across the load at the desired level. However, if the increased current exceeds the rated value of the Zener diode, it can fail in such a way as to produce the short circuit.

It has been common practice to place a fuse in series with a transient suppressing semiconductor diode to prevent short circuiting the load. If the current through the diode exceeds its rated value and the diode fails, the fuse will blow and open the circuit path through the diode.

In some applications, it is desirable to combine the fuse and the diode within a single housing, such as in U.S. Pat. No. 3,693,048 Doversberger et al., and U.S. Pat. No. 3,575,645 Doversberger et al. It also is desirable that a housing provide at least one conductive lead for the diode. For such purposes, the housing can be metal. In such an instance, a second diode lead is insulatingly mounted through the metal housing. While such a package provides a number of benefits, when the fuse element blows or activates, fused metal can vaporize and condense within the housing to form a continuous coating on the inner wall of the housing. Special precuations must be made to avoid having this coating bridge the insulating mount between the second terminal lead and the metal housing so that a shorting condition does not exist through the circuit element itself. Prior art circuit elements have used involved packaging techniques to accomplish this end. Some have used a circuit breaker within the housing. Furthermore, one incurs the risk that the metallic fuse element while intact may contact the sides of the housing and cause a shorting condition therethrough.

OBJECTS AND SUMMARY OF THE INVENTION

Therefore, it is an object of this invention to provide a simple, low cost circuit element for suppressing electrical transients. This object is accomplished by a circuit element that includes a semiconductor diode wafer and a series connected distinctive integral fusible device encapsulated within a unitary housing. The distinctive fusible device includes a fuse element of a thin strip of metal which will melt upon a current in excess of its rated value flowing through it, and an insulating jacket of polyimide plastic surrounding a major portion of the fuse element. The insulating jacket electrically isolates the metallic fuse element from the housing while the fuse is intact, and prevents fragments and vaporized metal from dispersing within the housing when the fuse is blown.

DESCRIPTION OF THE PREFERRED EMBODIMENT

Figure 1:
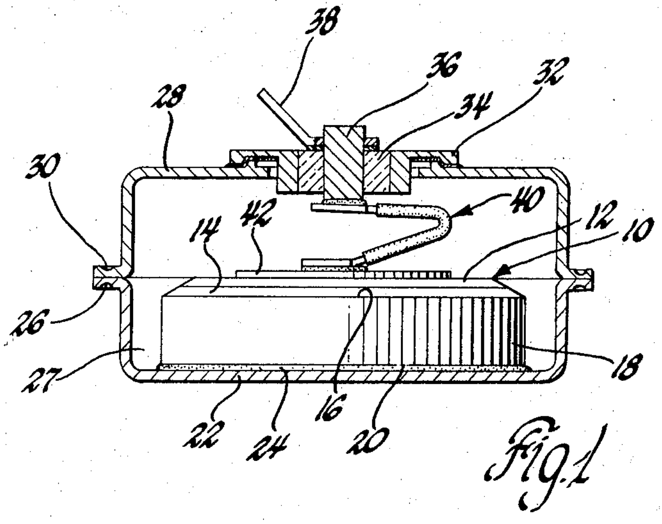
FIG. 1 is a cross-sectional view of the circuit element comprising this invention.

Referring now to the drawings, the circuit element includes a semiconductor diode wafer 10 having a region 12 on one face having one conductivity type and a region 14 of the opposite conductivity type on the other face forming a PN junction therebetween. In this example, the diode wafer is preferably a silicon Zener diode wafer that is soldered to a thermal expansion compensating element.

Molybdenum disc 18 serves as the thermal expansion compensating element. Molybdenum disc 18 has two major parallel faces 16 and 20. The face of diode wafer 10 formed by region 14 is soldered to face 16 of the molybdenum disc. The molybdenum disc is considerably thicker than diode wafer 10 and has a coefficient of thermal expansion similar to that of silicon. The diode wafer 10 and disc 18 are seated within a cup-shaped metallic housing member 22 with face 20 of disc 18 soldered at 24 to housing member 22. Molybdenum disc 18 serves as a heat sink and also reduces stress due to dissimilar coefficients of expansion between the silicon diode wafer 10 and the metallic housing member 22. Tungsten and Kovar display expansion characteristics similar to molybdenum and therefore may be used as a substitute for molybdenum as the thermal expansion compensating element.

Housing member 22 is generally cup-shaped and has a circumferential radially directed flange 26 and a recess 27 within which disc 18 is disposed. Housing member 22 is identical to the housing covers used in standard JEDEC TO-3 cold welded housings. Although copper is preferred, the housing member 22 may be of aluminum, or any other suitable metal. Housing member 28 is identical to that of housing member 22 except for a centrally located opening therethrough. Flange 30 of housing member 28 is registered with flange 26 of housing member 22 and are cold-welded together. Housing member 28 serves as a cover for housing member 22 and both define a cavity in which the principal parts of the circuit element are disposed. Copper insert 32 partially protrudes within the cavity. Insert 32 has an opening therethrough and a circumferential radially directed flange which is secured to housing member 28 outside the cavity. A glass insulating ring 34 having an opening therethrough is secured within the opening of insert 32. A copper rod serving as stud 36 extends through the opening of glass insulating ring 34 which holds it rigidly in place. Glass insulating ring 34 provides a hermetic seal between insert 32 and stud 36. A generally flat copper terminal 38 is soldered to a portion of stud 36 which extends from the cavity. Terminal 38 and stud 36 form an electrically conductive lead.

Figure 2:
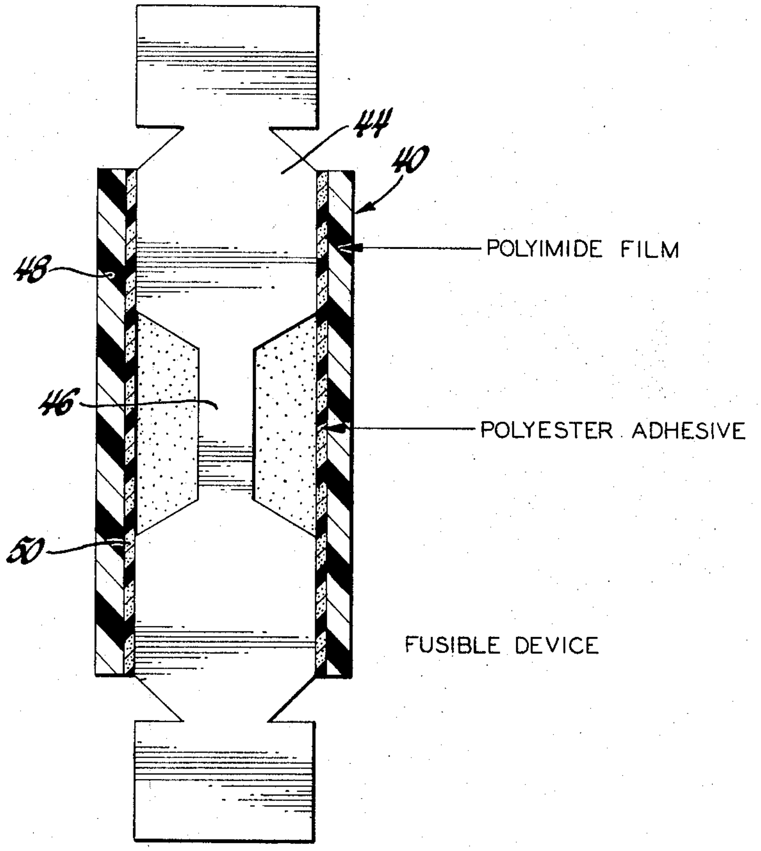
FIG. 2 is an enlarged sectional view of the distinctive fusible device.

Special attention is now drawn to fusible device 40. The fusible device 40 makes the electrical connection between stud 36 and an aluminum electrode 42 on region 12 of diode wafer 10. The fusible device 40 consists of two main parts, as can be seen in FIGS. 1 and 2. The first part is the fuse element 44 which is a thin strip of zinc with a nickel plating thereon for solderability. However, metals other than zinc may be used, of course, for the fuse element. The configuration of the fuse element 44 is similar to that used in conventional home fuses. That is, the edges of the metallic strip are indented forming a centrally located filamentary portion 46. The dimensions of the fuse element 38 will vary for different applications. In this example, the fuse element 44 is approximately 0.015 inch thick, 1 1/18 inches long and ⅛ inch wide with filamentary portion 46 being approximately 0.0625 inch wide.

The second main part of the fusible device 44 is an insulating jacket 48 of polyimide plastic. The insulating jacket 48 surrounds a major portion of the fuse element 44 including filamentary portion 46. Polyimide plastic films from any commercial source can be used for insulating jacket 48. However, I prefer a polyimide film 0.001 inch thick that is distributed by E. I. DuPont de Nemours & Company, Inc. under the tradename Kapton. Such films are stable at relatively high temperatures. These films are wholly aromatic polyimides derived from aromatic dianhydrides and aromatic diamines (AA-BB polyimides) or from aromatic compounds containing both an amine and an anhydride group (A-B polyimides). The polyimide film is electrically non-conductive, has no melting point, and is self-extinguishing as to flammability. The insulating jacket 48 is secured to the fuse element 44 by a polyester adhesive 50. In this example, the adhesive 50 is approximately 0.0017 inch thick. Other adhesives with high melting temperatures such as a silicone adhesive can also be used. The insulating jacket 48 has a two fold purpose. First, it electrically insulates the metallic fuse element 44 from the surrounding housing members 22 and 28. Secondly, it prevents fuse metal, if and when the fuse element is blown, from dispersing within the housing. This insures that a shorting condition will not be created through the circuit element by fuse fragments or vaporized fuse metal condensing within the housing cavity and bridging insulating glass ring 34.

It should be evident to one skilled in the art that although this invention has been described in connection with a certain specific example thereof, no limitation is intended thereby except as defined in the appended claims.

What is claimed is:

1. A circuit element for suppressing electrical transients, said circuit element having a semiconductor diode and a fusible device within a single housing, said circuit element comprising, a semiconductor diode wafer having two major faces of opposite type conductivity having a PN junction therebetween, two housing members made of an electrically conductive material, each of said housing members being generally of a cup-shaped configuration and having a circumferential radially directed flange portion, said housing members in register and joined together at their flange portions to form a housing defining a cavity, a thermal expansion compensating element of an electrically conductive material having two major faces, one of said faces having a face of said diode affixed thereon in electrical contact therewith, the other face of the thermal expansion compensating element electrically connected within said cavity to one of said housing members, an electrically conductive lead extending through said other housing member and insulated therefrom, and a fusible device electrically connecting said lead and the other face of said diode, said fusible device including a fuse element of a thin strip of metal having a selected portion that will melt when a current of a predetermined value flows through it, and an insulating polyimide jacket closely surrounding said selected portion of said fuse element.

2. The circuit element described in claim 1 wherein said fusible device also includes a layer of polyester adhesive between said fuse element and said polyimide jacket, said polyester adhesive bonding said polyimide jacket to said fuse element.

* * * * *